United States Patent [19]

Haberhauer et al.

[11] Patent Number: 5,912,105
[45] Date of Patent: Jun. 15, 1999

[54] THERMALLY IMAGEABLE MATERIAL

[75] Inventors: Helmuth Haberhauer, Taunusstein; Mathias Eichhorn, Niedernhausen, both of Germany

[73] Assignee: Agfa-Gevaert, Mortsel, Belgium

[21] Appl. No.: 08/997,390

[22] Filed: Dec. 23, 1997

Related U.S. Application Data

[60] Provisional application No. 60/047,808, May 19, 1997.

[30] Foreign Application Priority Data

Dec. 23, 1996 [EP] European Pat. Off. ............. 96203673

[51] Int. Cl.$^6$ .............................. G03F 7/095; G03F 7/20; G03F 7/30
[52] U.S. Cl. ......................................... 430/273.1; 430/302
[58] Field of Search ................................ 430/273.1, 302, 430/5

[56] References Cited

U.S. PATENT DOCUMENTS

| | | | |
|---|---|---|---|
| 3,753,715 | 8/1973 | Klüpfel et al. | 430/273.1 |
| 5,478,695 | 12/1995 | Leenders | 430/302 |
| 5,609,993 | 3/1997 | Hase et al. | 430/302 |
| 5,705,310 | 1/1998 | Van Zoeren | 430/273.1 |

FOREIGN PATENT DOCUMENTS

| | | |
|---|---|---|
| 0 275 147 | 7/1988 | European Pat. Off. . |
| 0 509 514 | 10/1992 | European Pat. Off. . |
| 0 573 092 | 12/1993 | European Pat. Off. . |

OTHER PUBLICATIONS

Patent Abstract of JP 02–286335, Feb. 7, 1991.

*Primary Examiner*—Cynthia Hamilton
*Assistant Examiner*—Sin J. Lee
*Attorney, Agent, or Firm*—Foley & Lardner

[57] ABSTRACT

Thermally imageable material, consisting of a substrate and two layers (a) and (b) built up thereon in the stated sequence:

(a) a photopolymer layer which is sensitive to radiation in the near UV and in the visible range but not very sensitive to radiation in the infrared range and (b) a layer which is transparent to radiation in the near UV and in the visible range, only slightly permeable to oxygen and more permeable to oxygen under the influence of radiation in the infrared range than before exposure.

11 Claims, No Drawings

THERMALLY IMAGEABLE MATERIAL

This application claims the benefit of U.S. Provisional Application Ser. No. 60/047,808, filed on May 19th, 1997.

DESCRIPTION

1. Field of the Invention

The invention relates to a thermally imageable material and a process for the production of a printing plate precursor for offset printing with the use of the material according to the invention.

2. Background of the Invention

The conventional production of printing plate precursors for offset printing is effected by placing a film containing text and image information on a substrate having a photosensitive coating and then carrying out exposure to radiation which contains components in the near UV and in the visible range. The photosensitive coatings used in positive-working materials are predominantly o-quinonediazides, whereas polycondensates of diazonium salts or photopolymer systems crosslinking by means of free radicals are commonly used in negative-working materials. These plates are usually processed under yellow light.

Recent developments permit images from digital data sets to be transferred directly to precoated offset printing plates. In these so-called "computer-to-plate" processes, very highly photosensitive materials are exposed imagewise to lasers which emit radiation in the visible range (488 nm, 532 nm). In the processing of such photopolymer-based printing plates, as described, for example, in EP 0537805 and EP 0704764, daylight or yellow light must be strictly excluded. Other materials based on silver additionally require the printer to change his usual procedure since the plates show unconventional behaviour (ink acceptance, print run) in the printing press.

Recently, it has become possible to use lasers which emit at longer wavelengths for digital image production on printing plates, in particular laser diodes emitting in the range from 780 to 830 nm and solid-state lasers emitting in the region of 1060 or 1064 nm being at the centre of interest since lasers of this type having high powers are relatively economically available. The thermally imageable offset printing plates required for this type of exposure can in principle be processed in daylight when appropriately sensitized. It is necessary to strive for conventional printing behaviour of printing plate precursors produced in this manner in the printing press so that the printer can retain well established procedures.

Thermally imageable materials for the production of offset printing plate precursors are known.

The printing plate material described in EP 0580393 is a two-layer material for waterless offset printing, which material manages without a development step and in which a silicone top layer is removed (ablated) from the hydrophilic lower layer during exposure to infrared radiation.

EP 0625728 and EP 0672954 describe a printing plate material which consists of one layer and can be imaged both in the infrared and in the UV range and can be used for reverse processing. The crosslinking of a resol resin/novolak resin mixture is initiated by the acid liberated on exposure from a photochemical acid donor sensitized for the IR range and is completed by a postbake step. For longer runs, it is necessary to bake this material, as disclosed, for example for diazo layers, in British Patent No. 1154749.

EP 0720057 claims a two-layer material which consists of a substrate, a photosensitive layer and a top layer. The substrate preferably consists of superficially roughened and anodically oxidized aluminium. The photosensitive layer may be a positive- or negative-working layer. The negative-working layer generally comprises a diazonium salt, an unsaturated compound capable of addition polymerization and a photopolymerization initiator. Present on this photosensitive layer is a top layer which contains, as essential components, a binder which is soluble in water or aqueous alkali and a dye absorbing in the IR range, as well as a dye which absorbs in the wavelength range in which the photosensitive layer is sensitive. As a result of the action of IR radiation, the top layer is removed (ablated). Those parts of the top layer which have not been removed act as an exposure mask in the subsequent uniform exposure. In those parts of the photosensitive layer which are not masked, a photochemical reaction is initiated and changes the solubility of the corresponding layer parts in a developer liquid. In the masked parts, a photochemical reaction of the photosensitive layer is prevented. In the subsequent development, the mask and the soluble parts of the photosensitive layer are removed.

It is an object of the invention to provide an imaging element for making waterless offset printing plates in a new and easy way.

SUMMARY OF THE INVENTION

The present invention describes a thermally imageable material and a process for the production of a printing plate precursor for offset printing with the use of this material. The material according to the invention consists of a substrate, a photopolymer layer (a) which is crosslinkable by means of free radicals and is sensitive to radiation in the near UV and in the visible range but not very sensitive to radiation in the infrared range, and a layer (b) which is transparent to radiation in the near UV and in the visible range, only slightly permeable to oxygen and more permeable to oxygen under the influence of radiation in the infrared range than before exposure.

Detailed Description of the Invention

The following may be used as substrate material for the offset printing plates: mechanically or electrochemically roughened and, if required, anodized aluminium which furthermore may have been pretreated chemically, for example with polyvinylphosphonic acid, silicates or phosphates, and furthermore multimetal plates having Cu/Cr or brass/Cr as the uppermost layer. Films of other materials which have been hydrophilized by appropriate pretreatments, such as, for example, polyester films, are also suitable.

Photopolymer layers which absorb in the near UV or in the visible spectral range, are crosslinkable by means of free radicals and are intended for use in offset printing plate layers have long been known and are widely used (cf. for example J. P. Fouassier and J. F. Rabek, *Radiation Curing Science and Technology,* Plenum, New York, 1993). Compared with other technologies used, photopolymer systems are distinguished by short exposure times and the high print runs achievable.

In principle, any photopolymer system which absorbs in the near UV or in the visible spectral range is suitable as photopolymer layer (a) crosslinkable by means of free radicals, provided that its crosslinkability in the presence of atmospheric oxygen is lower than that in the absence thereof. Suitable systems contain a polymeric binder (A), a polymerizable compound (B) containing at least two ethylenically unsaturated units and a photoinitiator system (C) which produces free radicals under the influence of radiation in the near UV or in the visible range as essential components.

Examples of polymeric binders (A) which may be used are polyalkyl (meth)acrylates in which the alkyl group is, for example, methyl, ethyl, n-butyl, isobutyl, n-hexyl or 2-ethylhexyl; copolymers of the stated alkyl (meth)acrylates with at least one monomer, such as acrylonitrile, vinyl chloride, vinylidene chloride, styrene or butadiene; polyvinyl acetate, vinyl acetate copolymers, polyurethanes, methylcellulose, ethylcellulose, polyvinyl formal and polyvinyl butyral.

Particularly suitable binders are those which are insoluble in water, soluble in organic solvents and soluble or at least swellable in aqueous alkaline solutions. Binders which contain acidic groups, e.g. carboxyl groups or phenolic OH groups, such as copolymers of (meth)acrylic acid and/or its unsaturated homologs, such as crotonic acid, copolymers of maleic anhydride or its half-esters, reaction products of polymers containing hydroxyl groups with di- or tricarboxylic anhydrides and mixtures thereof and homo- or copolymers of hydroxystyrene, should be mentioned in particular.

The polymers described above are particularly suitable when they have a molecular weight of between 500 and 200,000 or higher, preferably 1,000 to 100,000, and have either acid numbers between 10 and 250, preferably from 20 to 200, or hydroxyl numbers between 50 and 750, preferably from 100 to 500.

Preferred polymeric binders (A) are copolymers of (meth)acrylic acid with alkyl (meth) acrylates, alkenyl (meth)acrylates, (meth)acrylonitrile or the like;

vinyl acetate copolymers;

copolymers of crotonic acid with vinyl acetate, alkyl (meth)acrylates, alkenyl (meth)acrylates, (meth) acrylonitrile or the like;

copolymers of vinylacetic acid with alkyl (meth)acrylates and/or alkenyl (meth)acrylates;

copolymers of maleic anhydride with optionally substituted styrenes, unsaturated hydrocarbons, unsaturated esters or ethers;

esterification products of the copolymers of maleic anhydride;

products of the esterification of polymers containing hydroxyl groups with anhydrides of di- or polycarboxylic acids, e.g. of copolymers of hydroxyalkyl (meth) acrylates with alkyl (meth)acrylates, (meth) acrylonitrile or the like, of polyurethanes having a sufficient number of OH groups, of epoxy resins, polyesters, partially hydrolyzed vinyl acetate copolymers, polyvinyl acetals having free OH groups, polyhydroxystyrene, copolymers of hydroxystyrenes with alkyl (meth)acrylates or the like;

phenol/formaldehyde resins, e.g. novolaks;

and homo- and copolymers of hydroxystyrene.

The amount of the polymeric binder (A) in the photopolymer layer (a) crosslinkable by means of free radicals is in general 5 to 80, preferably 25 to 60, % by weight.

Suitable polymerizable compounds (B) having at least two ethylenically unsaturated units are known and are described, for example, in U.S. Pat. No. 2,760,863 and U.S. Pat. No. 3,060,023.

Preferred examples are acrylates and methacrylates of dihydric and polyhydric alcohols, such as ethylene glycol diacrylate, acrylates or methacrylates of trimethylolethane, trimethylolpropane, pentaerythritol and dipentaerythritol and of polyhydric alicyclic alcohols or N-substituted acrylamides and methacrylamides. Reaction products of mono- or diisocyanates with partial esters of polyhydric alcohols are also advantageously used. Such monomers are described in DE 2064079, DE 2361041 and DE 2822190.

Compounds which contain at least one photooxidizable and optionally at least one urethane group in the molecule may also be used. Examples of such polymerizable compounds are described in EP 287818, EP 355387 and EP 364735.

The proportion of the polymerizable compounds (B) in the photopolymer layer (a) is in general about 20 to 90, preferably 35 to 70, % by weight.

Photoinitiator systems (C) which produce free radicals under the influence of radiation in the near UV or in the visible range are known and are described, for example, in *Chemistry and Technology of UV and EB formulations for coatings, inks and paints,* Vol. 3, Sita Technology Ltd., London, 1991. In the mixture according to the invention, it is possible to use, for example, α-carbonyl compounds (for example described in U.S. Pat. No. 2,367,660); hexaarylbisimidazoles, also as a mixture with further photoinitiators (DE 4009700); triazines (U.S. Pat. No. 4,189, 323, EP 0137452) and acridines as well as phenazines (U.S. Pat. No. 3,751,259), also in combination with one another or with other photoinitiators.

The members of the class consisting of the trihalomethyl-s-triazines, especially the bistrichloromethyl-s-triazines, and the 9-phenylacridines are particularly preferred for use in the photopolymerizable layer (a), also in combination with one another. If particularly high sensitivities in the visible spectral range are desired, it is advisable to add a metallocene initiator system, especially a combination of metallocene and a trihalomethyl compound cleavable by radiation, as described in EP 364735.

The proportion of photoinitiator system (C) in the photopolymer layer (a) is in general about 2 to 15, preferably 5 to 10, % by weight.

The photopolymerizable layer (a) may also contain small amounts of various substances as additives for special requirements, such as flexibility, adhesion, gloss, etc. Examples are: inhibitors for preventing the thermal polymerization of the monomers, hydrogen donors, dyes, coloured and uncoloured pigments, dye precursors, indicators, plasticizers, chain-transfer agents and wetting agents.

Finally, soluble or finely divided dispersible dyes and, depending on the intended use, also UV absorbers may be added to the photosensitive mixtures. The dyes which have proved particularly suitable are the triphenylmethane dyes. The most advantageous ratios of the components can be readily determined in the specific case by preliminary experiments.

Suitable solvents for the application of the photopolymerizable layer (a) are ketones, such as methyl ethyl ketone, chlorinated hydrocarbons, such as trichloroethylene and 1,1,1-trichloroethane, alcohols, such as n-propanol, ethers, such as tetrahydrofuran, alcohol ethers, such as ethylene glycol monoethyl ether, and esters, such as butyl acetate. It is also possible to use mixtures which may additionally contain solvents, such as acetonitrile, dioxane or dimethylformamide, for special purposes. In principle, it is possible to use all solvents which do not react irreversibly with the layer components.

However, the choice of the solvent should be tailored to the intended coating process, the layer thickness and the drying apparatus. Thin layers up to about 5 μm are applied for test quantities, preferably by spin-coating. With solutions having a solids content of up to about 40%, layer thicknesses of more than 60 μm are thus achievable by a single application or with a doctor blade. Dip coating is preferred for two-sided coating, the use of low-boiling solvents having the advantage of rapid initial drying. Strip coating is carried out by application by means of rollers, slot dies or spraying; single plates, such as zinc and multimetal plates, can be coated by means of a curtain coater.

The usual apparatuses and conditions may be used for drying after the coating of the photopolymer layer (a) crosslinkable by means of free radicals, temperatures of about 100° C. and briefly up to 120° C. being tolerated without losses of radiation sensitivity.

The layer (b) which is transparent to radiation in the near UV and in the visible range, only slightly permeable to oxygen and more permeable to oxygen under the influence of radiation in the infrared range than before exposure preferably consists of a material which dissolves in the developer liquid or can be detached, at least in the parts affected by infrared radiation, during the development. Materials suitable for this purpose are, for example, polyvinyl alcohol, polyvinylpyrrolidone, polyphosphates, sugar, etc.

Suitable sensitizers are required to ensure that the top layer (b) is sensitive to infrared radiation. For example, it is possible to use dyes which absorb in the infrared spectral range, as described, for example, in M. Matsuoka, *Infrared Absorbing Dyes,* Plenum Press, 1990, or in J. Fabian, Chem. Rev. 1992, 92, 1197–1226. Carbon black is preferably used since sensitization can be achieved in this manner with the same formulation for the range of both the diode lasers (780–830 nm) and the solid-state lasers (1060 or 1064 nm).

The top layer (b) is produced by dissolving or dispersing a preferably water-soluble resin and the component absorbing infrared radiation in a suitable solvent and applying the solution obtained as a coat on the photopolymer layer (a). Suitable solvents are those which do not react with the photopolymer layer (a) and do not partially dissolve it. A particularly preferred solvent is water, to which additives, such as, for example, adhesion promoters or dispersants, may be added in small amounts.

However, the choice of the solvent should be tailored to the intended coating process, the layer thickness and the drying apparatus. Thin layers up to about 5 μm are applied for test quantities, preferably by spin-coating. With solutions having a solids content of up to about 40%, layer thicknesses of more than 60 μm are thus achievable by a single application or with a doctor blade. Dip coating is preferred for two-sided coating, the use of low-boiling solvents having the advantage of rapid initial drying. Strip coating is carried out by application by means of rollers, slot dies or spraying; single plates, such as zinc and multimetal plates, can be coated by means of a curtain coater.

In principle, any material which is transparent to radiation in the near UV and in the visible range and changes its oxygen permeability under the action of infrared radiation appears suitable for the top layer (b). For example, self-supporting top layers of suitably pretreated polyester film, which are peeled off before development of the photopolymer layer crosslinkable by means of free radicals, are also suitable.

Unlike the prior art described, the material according to the invention is based on the concept of a chemical mask. In contrast to optical mask systems, as described, for example, in EP 0720057, the top layer (b) has a transparency to radiation of the wavelength range to which the photopolymer layer (a) is sensitive. The required differentiation for the uniform exposure following the IR exposure is achieved by a physicochemical modification of the mask—of the permeability to oxygen. The change in the solubility of the photopolymer layer (a) occurs in the parts protected by the top layer (b) which has remained unchanged.

The processing of the material according to the invention is carried out by the following process, which is also part of the invention:

The material according to the invention is exposed imagewise to infrared radiation, for example an Nd-YAG laser (emission at 1064 nm), which is controlled by programmed linear or screening movement, in order to increase the oxygen permeability of the top layer (b).

Uniform exposure is then carried out with radiation in the near UV and/or in the visible spectral range in order to crosslink the photopolymer layer (a) crosslinkable by means of free radicals, in the parts which were not exposed to the infrared radiation. In the parts where the top layer (b) was exposed to infrared radiation, no crosslinking of the photopolymer layer (a) is possible owing to the increased admission of oxygen to said layer.

This is optionally followed by a postbake step in order to complete the crosslinking of the photopolymer layer (a).

In the development step, the top layer (b) and the uncrosslinked parts of the photopolymer layer (a) are removed. This can be effected jointly in one developer liquid or in two separate steps, optionally with two different developer liquids.

For example, an apparatus as described in EP 0580394 can be used for producing an image on the material according to the invention. Commercial plate and film exposure units are also suitable, provided that they are equipped with a laser or another suitable light source which emits in the near IR range (780–1100 nm).

The usual copying units, such as fluorescent tubes, pulsed xenon lamps, metal halide-doped high-pressure mercury vapour lamps and carbon arc lamps, may be used for the uniform exposure to radiation in the near UV and/or in the visible spectral range, which is required after the imagewise exposure to infrared radiation. Contact exposure to conventional incandescent lamps is also possible. The exposure can also be effected in a continuous procedure by means of a uniform exposure unit upstream of the actual developing machine.

The uniformly exposed layer (a) can be removed—optionally after a thermal aftertreatment step to complete the crosslinking reaction—together with the top layer (b) using virtually the same developers as those for commercial photopolymer systems, or the layers according to the invention can advantageously be tailored in their exposure conditions to the known auxiliaries, such as developers and programmed sprayers or immersion bath development apparatuses. The aqueous developer solutions may contain, for example, alkali metal phosphates, silicates or hydroxides and furthermore wetting agents and relatively small proportions of organic solvents. In certain cases, solvent/water mixtures may also be used as developers. The most advantageous developer can be determined by experiments with the layer used in each case. If required, the development can be mechanically supported.

It may be advantageous to remove the top layer in a step upstream of the actual development. This can be effected in the simplest case by rinsing off with water to which additives, such as, for example, surfactants, are optionally added in small amounts. If required, rinsing can be mechanically supported.

The Examples below illustrate the preferred embodiments of the thermally imageable mixture according to the invention, without restricting the invention to these.

EXAMPLE 1 (Ei-Or-3064)

A solution of 5.5 parts by weight of a copolymer of methyl methacrylate and methacrylic acid (ratio 64:36) which was reacted with glycidyl methacrylate in a molar ratio of 3:1 (acid number 85), 6.5 parts by weight of an aliphatic urethane acrylate (Ebecryl 1290 from UCB Chemicals), 0.2 part by weight of 2,4-bistrichloromethyl-6-(4-styrylphenyl)-s-triazine, 0.3 part by weight of 9-phenylacridine, 0.2 part by weight of bis(cyclopentadienyl)-bis(2,6-difluoro-3-[pyrr-1-yl]-phenyl)titanium, 0.1 part by weight of leuco crystal violet, 60 parts by weight of propylene glycol monomethyl ether and 27 parts by weight of butanone was applied to electrolytically roughened and anodized aluminium foil. The layer was dried for 2 minutes in a forced-circulation drying oven at 100° C. so that a layer weight of 2 g/m$^2$ resulted. A 7% strength aqueous solution of polyvinyl alcohol, to which 0.1% of carbon black in water-dispersible form (e.g. carbon black paste Derussol P 130 from Degussa) had been added, was applied in a thickness such that a layer weight of 1.5 g/m$^2$ was obtained after drying (2 minutes in a forced-circulation drying oven at 100° C.).

The precoated printing plate thus produced was provided with an image by means of an Nd-YAG laser with infrared radiation of wavelength 1064 nm in an external drum exposure unit with an energy of 1500 mJ/cm$^2$, uniformly exposed to radiation in the near UV and in the visible range with an energy of 25 mJ/cm$^2$ in a printing frame and developed in a developer composed of 1 part by weight of trisodium citrate·2H$_2$O, 2 parts by weight of 1-aminopropan-2-ol, 1.4 parts by weight of benzyl alcohol, 0.6 part by weight of sodium cumenesulphonate, 0.05 part by weight of sodium metasilicate·5H$_2$O, 0.02 part by weight of a fatty alcohol polyglycol ether and 94 parts by weight of water.

Satisfactory reproduction of the image sections was obtained, while the nonimage parts were completely removed by development.

EXAMPLE 2 (Ei-Or 3082)

A solution of 4.5 parts by weight of a copolymer of methyl methacrylate and methacrylic acid (weight ratio 85:15, acid number 115), 3.2 parts by weight of the reaction product of 1 mol of hydroxyethyl-piperidine, 2 mol of hexamethylene diisocyanate and 2 mol of hydroxyethyl methacrylate, 2.4 parts by weight of the reaction product of 1 mol of 2,2,4-trimethylhexane 1,6-diisocyanate and 2 mol of hydroxyethyl methacrylate, 0.2 part by weight of 2,4-bistrichloromethyl-6-(4-styrylphenyl)-s-triazine, 0.2 part by weight of 9-phenylacridine, 0.1 part by weight of leuco crystal violet, 60 parts by weight of propylene glycol monomethyl ether and 27 parts by weight of butanone was applied to electrolytically roughened and anodized aluminium foil. The layer was dried for 2 minutes in a forced-circulation drying oven at 100° C. so that a layer weight of 2.3 g/m$^2$ resulted. A 7% strength aqueous solution of polyvinyl alcohol, to which 0.5% of carbon black in water-dispersible form (e.g. carbon black paste Derussol P 130 from Degussa) had been added, was applied in a thickness such that a layer weight of 1.5 g/m$^2$ was obtained after drying (2 minutes in a forced-circulation drying oven at 100° C.).

The precoated printing plate obtained was provided with an image by means of an Nd-YAG laser with infrared radiation of wavelength 1064 nm in an external drum exposure unit with an energy of 300 mJ/cm$^2$, uniformly exposed to radiation in the near UV and in the visible range with an energy of 50 mJ/cm$^2$ in a printing frame, postbaked for 1 minute at 100° C. in a forced-circulation drying oven and developed in a developer having the composition of Example 1. When clamped in a printing press, the printing plate precursor produced in this manner gave more than 50,000 satisfactory prints.

EXAMPLE 3 (Ei-Or-3053)

A 7% strength aqueous solution of polyvinyl alcohol, to which 0.5% by weight of carbon black in water-dispersible form (e.g. carbon black paste Derussol P130 from Degussa) and 0.2% by weight of a nitrocellulose, dissolved in propylene glycol monomethyl ether, had been added, was applied to a photopolymer layer, produced and applied analogously to the first coating step in Example 2, in a thickness such that a layer weight of 1.5 g/m$^2$ was obtained after drying (2 minutes in a forced-circulation drying oven at 100° C.).

The photosensitive coating obtained was provided with an image by means of an Nd-YAG laser with infrared radiation of 1064 nm in an external drum exposure unit with an energy of 300 mJ/cm$^2$, uniformly exposed to radiation in the near UV and in the visible range with an energy of 25 mJ/cm in a printing frame, postbaked for 1 minute at 100° C. in a forced-circulation drying oven and developed in a developer having the composition of Example 1, satisfactory reproduction of the original digital image being achieved.

EXAMPLE 4

The precoated printing plate produced analogously to Example 2 was provided with an image by means of a laser diode with infrared radiation of wavelength 830 nm in an external drum exposure unit with an energy of 250 mJ/cm$^2$, uniformly exposed to radiation in the near UV and in the visible range with an energy of 50 mJ/cm$^2$ in a printing frame, postbaked for 1 minute at 100° C. in a forced-circulation drying oven and developed in a developer having the composition of Example 1. When clamped in a printing press, the printing plate precursor produced in this manner gave more than 50,000 satisfactory prints.

EXAMPLE 5

The precoated printing plate produced analogously to Example 2 was provided with an image by means of an Nd-YAG laser with infrared radiation of wavelength 1064 nm in an internal drum exposure unit with an energy of 360 mJ/cm$^2$, uniformly exposed to radiation in the near UV and in the visible range with an energy of 50 mJ/cm$^2$ in a printing frame, postbaked for 1 minute at 100° C. in a forced-circulation drying oven and developed in a developer having the composition of Example 1, a satisfactory printing plate precursor being obtained.

EXAMPLE 6 (Ei-Or 3091)

A solution of 6 parts by weight of a copolymer of methyl methacrylate and methacrylic acid (ratio 64:36) which was reacted with glycidyl methacrylate in a molar ratio of 3:1 (acid number 85), 3 parts by weight of the reaction product of 1 mol of hydroxyethylpiperidine, 2 mol of hexamethylene diisocyanate and 2 mol of hydroxyethyl methacrylate, 0.04 part by weight of 2,4-bistrichloromethyl-6-(4-styrylphenyl)-s-triazine, 0.2 part by weight of bis(cyclopentadienyl)-bis(2,6-difluoro-3-[pyrr-1-yl]-phenyl)titanium, 0.3 part by weight of Flexo blue, 20 parts by weight of diethylene glycol dimethyl ether, 57 parts by weight of propylene glycol monomethyl ether and 12 parts by weight of butanone was applied to electrolytically roughened and anodized aluminium foil. The layer was dried for 2 minutes in a forced-circulation drying oven at 100° C. so that a layer weight of 2.1 g/m$^2$ resulted. A 7% strength aqueous solution of polyvinyl alcohol, to which 0.1% of carbon black in water-dispersible form (e.g. carbon black paste Derussol P 130 from Degussa) had been added, was applied in a thickness such that a layer weight of 1.7 g/m$^2$ was obtained after drying (2 minutes in a forced-circulation drying oven at 100° C.).

The photosensitive coating obtained was provided with an image by means of an Nd-YAG laser with infrared radiation of wavelength 1064 nm in an external drum exposure unit with an energy of 300 mJ/cm$^2$, uniformly exposed to radiation in the near UV and in the visible range with an energy of 50 mJ/cm$^2$ in a printing frame and developed in a developer having the composition of Example 1, satisfactory image reproduction being obtained.

We claim:

1. Thermally imageable material, consisting of a substrate and two layers (a) and (b) built up thereon in the stated sequence:

a) a photopolymer layer which is sensitive to radiation in the near UV and in the visible range but not very sensitive to radiation in the infrared range and b) a layer which is transparent to radiation in the near UV and in the visible range, only slightly permeable to oxygen and more permeable to oxygen under the influence of radiation in the infrared range than before exposure.

2. Material according to claim 1, wherein on exposure to radiation with admission of oxygen, the photopolymer layer (a) has a crosslinkability which is limited compared with exposure to radiation without admission of oxygen.

3. Material according to claim 1, wherein the photopolymer layer (a) contains, as essential components, A) a polymeric binder, B) a polymerizable compound containing at least two ethylenically unsaturated units and C) a photoinitiator system which produces free radicals under the influence of radiation in the near UV or in the visible range.

4. Material according to claim 1, wherein the layer (b) which is only slightly permeable to oxygen contains, as essential components, I) a polymeric binder and II) a substance absorbing infrared radiation.

5. Material according to claim 4, wherein the substance (II) absorbing infrared radiation contains carbon black particles.

6. Material according to claim 4, wherein the substance (II) absorbing infrared radiation comprises carbon black.

7. Process for the production of a printing plate precursor for offset printing, wherein a material according to claim 1 is exposed imagewise to infrared radiation in order to increase the oxygen permeability of the upper layer (b) in the exposed parts;

is then uniformly exposed to radiation in the near UV and/or in the visible range in order to initiate crosslinking of the lower layer (a) in the parts where the oxygen permeability of the upper layer (b) is unchanged and is developed in an aqueous alkaline developer in order to remove the upper layer (b) completely and the uncrosslinked parts of the lower layer (a).

8. Process for the production of a printing plate precursor for offset printing, wherein a postbake step in which the material reaches a temperature of from 70° C. to 150° C., is introduced after the uniform exposure step in the process according to claim 7.

9. Process for the production of a printing plate precursor for offset printing, wherein a postbake step in which the material reaches a temperature of from 80° C. to 130° C. is introduced after the uniform exposure step in the process according to claim 7.

10. Process for the production of a printing plate precursor for offset printing, wherein a postbake step in which the material reaches a temperature of from 90° C. to 120° C. is introduced after the uniform exposure step in the process according to claim 7.

11. Process for the production of a printing plate precursor for offset printing, wherein a material according to claim 1 is exposed imagewise to infrared radiation in order to increase the oxygen permeability of the upper layer (b) in the exposed parts;

is then uniformly exposed to radiation in the near UV and/or in the visible range in order to initiate crosslinking of the lower layer (a) in the parts where the oxygen permeability of the upper layer (b) is unchanged;

is developed in an aqueous developer liquid or pure water in order to remove the upper layer (b) completely and is developed in an aqueous alkaline developer in order to remove the uncrosslinked parts of the lower layer (a).

* * * * *